(12) United States Patent
Mueller et al.

(10) Patent No.: US 7,868,452 B2
(45) Date of Patent: Jan. 11, 2011

(54) ULTRATHIN SEMICONDUCTOR CIRCUIT HAVING CONTACT BUMPS

(75) Inventors: Dirk Mueller, Bergisch Gladbach (DE); Manfred Schneegans, Vaterstetten (DE); Sokratis Sgouridis, Annenheim (AT)

(73) Assignee: Infineon Technologies AG, Munich (DE)

( * ) Notice: Subject to any disclaimer, the term of this patent is extended or adjusted under 35 U.S.C. 154(b) by 89 days.

(21) Appl. No.: 11/441,978

(22) Filed: May 26, 2006

(65) Prior Publication Data
US 2006/0292849 A1  Dec. 28, 2006

Related U.S. Application Data

(63) Continuation of application No. PCT/EP2004/052258, filed on Sep. 21, 2004.

(30) Foreign Application Priority Data
Nov. 27, 2003  (DE) ............... 103 55 508

(51) Int. Cl.
*H01L 23/48* (2006.01)
*H01L 23/485* (2006.01)
(52) U.S. Cl. ............... 257/737; 257/781; 257/E23.021; 438/614
(58) Field of Classification Search ............... 257/737, 257/781, E23.021; 438/614
See application file for complete search history.

(56) References Cited

U.S. PATENT DOCUMENTS 3,623,961 A * 11/1971 van Laer ............ 438/614

| 6,118,179 | A | 9/2000 | Farnworth et al. |
|---|---|---|---|
| 6,338,980 | B1 | 1/2002 | Satoh |
| 6,462,415 | B1 | 10/2002 | Ishiguri et al. |
| 6,566,762 | B1 | 5/2003 | Baker et al. |
| 2002/0025585 | A1* | 2/2002 | Lam et al. ............ 438/1 |
| 2002/0031868 | A1 | 3/2002 | Capote et al. |
| 2002/0070423 | A1 | 6/2002 | Takafuji |
| 2003/0134496 | A1 | 7/2003 | Lee et al. |
| 2003/0160036 | A1 | 8/2003 | Liu |
| 2003/0214036 | A1 | 11/2003 | Sarihan et al. |

FOREIGN PATENT DOCUMENTS

| EP | 08148527 | 7/1996 |
|---|---|---|
| JP | 11349104 | 8/1999 |
| JP | 2001103041 | 2/2001 |

* cited by examiner

*Primary Examiner*—Davienne Monbleau
*Assistant Examiner*—Christopher M Roland
(74) *Attorney, Agent, or Firm*—Brinks Hofer Gilson & Lione

(57) ABSTRACT

The invention relates to an ultrathin semiconductor circuit having contact bumps and to a corresponding production method. The semiconductor circuit includes a bump supporting layer having a supporting layer thickness and having a supporting layer opening for uncovering a contact layer element being formed on the surface of a semiconductor circuit. An electrode layer is situated on the surface of the contact layer element within the opening of the bump supporting layer, on which electrode layer is formed a bump metallization for realizing the contact bump. On account of the bump supporting layer, a thickness of the semiconductor circuit can be thinned to well below 300 micrometers, with the wafer reliably being prevented from breaking. Furthermore, the moisture barrier properties of the semiconductor circuit are thereby improved.

9 Claims, 3 Drawing Sheets ance to carrier substrates or leadframes by various methods including wire, flip-chip and tape automated bonding methods which represent the most important methods. While in the case of the wire bonding method, the individual connection locations or connection pads on the semiconductor circuit or the semiconductor component are successively connected to the corresponding contact locations on the leadframe by means of fine wires (bonding wires). In the case of the flip-chip and tape automated bonding methods, the contact locations or contact pads on the semiconductor circuits or chips are simultaneously contact-connected to those on the carrier substrate in one operation. Therefore, the two last-mentioned techniques are more interesting in principle to the faster contact-connection. The flip-chip and tape automated bonding techniques are gaining in importance because of the increasing number of connection pads on the semiconductor circuit or the semiconductor component.

ULTRATHIN SEMICONDUCTOR CIRCUIT HAVING CONTACT BUMPS

CROSS REFERENCE TO RELATED APPLICATIONS

This application is a continuation of international application PCT/EP2004/052258, filed Sep. 21, 2004, which claims priority to German patent application serial number DE 10355508.0, filed Nov. 27, 2003.

BACKGROUND

1. Field of the Invention

The present invention relates to an ultrathin semiconductor circuit having contact bumps and to a corresponding production method.

2. Description of the Related Art

Semiconductor circuits or semiconductor components are electrically connected to carrier substrates or leadframes by various methods including wire, flip-chip and tape automated bonding methods which represent the most important methods. While in the case of the wire bonding method, the individual connection locations or connection pads on the semiconductor circuit or the semiconductor component are successively connected to the corresponding contact locations on the leadframe by means of fine wires (bonding wires). In the case of the flip-chip and tape automated bonding methods, the contact locations or contact pads on the semiconductor circuits or chips are simultaneously contact-connected to those on the carrier substrate in one operation. Therefore, the two last-mentioned techniques are more interesting in principle to the faster contact-connection. The flip-chip and tape automated bonding techniques are gaining in importance because of the increasing number of connection pads on the semiconductor circuit or the semiconductor component.

While in the case of the wire bonding technique, no further layers have to be applied to the contact pads, which preferably comprise aluminum, on the semiconductor circuit. Since the bonding wires, which comprise gold, can be bonded directly on the aluminum surface, it is necessary, for reliably carrying out the contact-connection according to the flip-chip and tape automated bonding methods, to form so-called contact bumps made of contact-connectable and solderable materials on the contact layer elements or contact pads of the semiconductor circuits.

For flip-chip mounting, solder bumps or contact bumps are generally made of material having a high melting point. This material generally comprises a homogeneous alloy material such as Sn/Pb (95/5), which are soldered with a solder deposit situated on the carrier substrate and likewise comprising a tin-lead alloy at low temperatures. In the case of this technique, a defined distance between semiconductor circuit or chip and carrier substrate can be set during the mounting process.

However, a large number of areas of application now demand the use of so-called ultrathin semiconductor circuits or ultrathin semiconductor components having a thickness of less than 300 micrometers. While semiconductor circuits which are contact-connected according to the wire bonding method have minor problems in this case, the above-described semiconductor circuits with contact bumps exhibit an extremely low yield on account of wafer breakages of the semiconductor wafers. These low yields result from the contact bumps (on the wafer front side) which project up to 90 micrometers and, during a grinding operation (on the wafer rear side), lead to a nonuniform pressure distribution and thus to an increased wafer breakage.

Additionally, for the concluding adhesive bonding of the semiconductor component to a carrier substrate after soldering, the conventional flip-chip methods exhibit an inadequate moisture resistance and adhesion on the molding composition used for a housing.

Therefore, there is a need for an ultrathin semiconductor circuit having contact bumps and a corresponding production method, which circuit has a sufficient resistance to breaking even in the case of thicknesses of less than 300 micrometers.

SUMMARY

According to one embodiment, the limitations of prior solutions are overcome by virtue of the use of a bump supporting layer formed on a surface of a semiconductor circuit. The forces acting on projecting contact bumps during mechanical processing, such as thinning for example, can be made uniform or absorbed, as a result of which a wafer breakage can be significantly reduced and the mechanical stability of the semiconductor circuit or of a semiconductor wafer having a multiplicity of semiconductor circuits can be significantly improved. Moreover, there is an improvement in the adhesive forces between the semiconductor circuit coated with the bump supporting layer and, for example, a molding composition for a component housing as a result of which a so-called delamination is prevented and a moisture resistance is significantly improved. A long-term failure of the packaged semiconductor circuit is thereby significantly reduced.

Preferably, the thickness of the semiconductor circuit is less than 100 micrometers and the supporting layer thickness is less than the bump height and greater than or equal to the difference between bump height and half the semiconductor circuit thickness. With such a layer thickness selection, it is possible to realize breakage-resistant semiconductor wafers and thus semiconductor circuits having a thickness of well below 100 micrometers. The bump height is approximately 90 micrometers on account of shear forces acting therein.

Furthermore, the modulus of elasticity of the supporting layer is approximately half as great as the modulus of elasticity of the contact bumps, as a result of which the breakage resistance of a semiconductor circuit or a semiconductor wafer can be improved further. Preferably, photosensitive BCB (benzocyclobutene) or so-called Su-8 is used as supporting layer. Supporting layer materials of this type have optimized adhesion properties of the bump supporting layer with respect to a plastic molding composition to be used for a housing, as a result of which a sufficient moisture resistance is obtained and, in particular, the occurrence of a delamination can be prevented.

With regard to the method, a bump supporting layer is preferably formed on the surface of the semiconductor circuit and this is patterned photolithographically in order to subsequently form the bump metallization on an electrode layer by means of the electrode layer and a further patterned auxiliary layer. By means of the auxiliary layer, which is ultimately removed again, it is possible for a height of the bump metallization to be set very simply and reliably, the bump supporting layer in turn increasing the mechanical strength in particular during a grinding operation for thinning the semiconductor circuit or an associated semiconductor wafer.

Further objects, features and advantages of this invention will become readily apparent to persons skilled in the art after a review of the following description, with reference to the drawings and claims that are appended to and form a part of this specification.

DETAILED DESCRIPTION

Figure 1A:
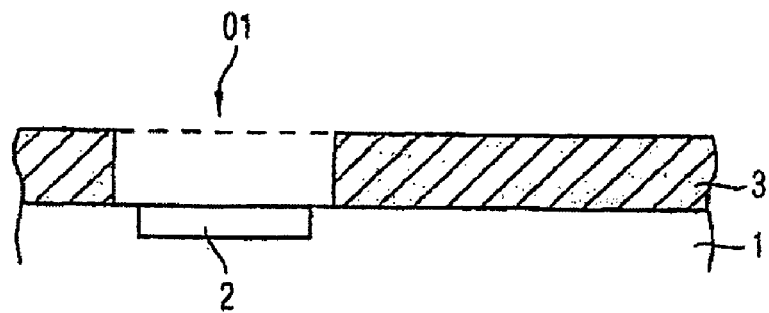
FIGS. 1A to 1F illustrate simplified sectional views for method steps in the production of an ultrathin semiconductor circuit in accordance with a first exemplary embodiment.

Referring to FIG. 1A, a contact layer element 2 is formed in the surface of a semiconductor circuit 1, which represents a wiring surface. The contact layer element 2 may represent a so-called Al contact pad in a topmost metallization plane of a wiring layer region. Situated in the underlying layer planes (not illustrated) of the semiconductor circuit 1 or the wiring layer region thereof, there are further metallization planes or insulating intermediate layers, down to a semiconductor substrate in which the actual semiconductor components are realized.

Silicon is preferably used as semiconductor material. A multiplicity of semiconductor circuits being formed on a semiconductor wafer. Semiconductor wafers of this type initially have a thickness of 700 to 750 micrometers, for which reason they are sufficiently mechanically stable and can thus be handled in a simple manner.

In order to improve a mechanical stability in particular during a subsequent process of thinning the semiconductor wafer or the semiconductor circuit, the invention provides firstly for forming on the surface of the semiconductor circuit 1, or of a passivation layer that is usually present, a bump supporting layer 3 having a supporting layer thickness $H_P$ at least in the vicinity of the contact layer element 2. A photosensitive plastic and in particular BSB (benzocyclobutene) or so-called Su-8 (procurable from Microchem, USA, www.microchem.com) is preferably used as such a bump supporting layer. These temperature-resistant and light-sensitive plastics are applied to the semiconductor circuit 1 with a predetermined supporting layer thickness $H_P$ by means of conventional resist coating methods and resist coating devices. Since a height of the contact bumps to be formed is approximately 90 micrometers in order to reduce shear forces that occur, the bump supporting layer has a thickness of 50 to 80 micrometers, preferably 60 micrometers.

Furthermore, in order to ensure a sufficient moisture resistance or a low risk of a delamination, as a result of which a failure of the semiconductor circuit is prevented, the adhesion properties of the bump supporting layer 3 are optimized with regard to a molding composition that is later to be used for forming a plastic housing. So-called "underfill adhesives" used hitherto may thus be obviated since the bump supporting layer 3 has outstanding adhesion properties both with respect to the housing molding composition and with respect to the semiconductor circuit 1 or the topmost layer thereof.

Furthermore, the bump supporting layer 3 is patterned via a photolithographic patterning, in order to form at least one supporting layer opening O1 in the bump supporting layer 3. This is near the at least one contact layer element 2. The surface of the contact layer element 2 is uncovered in this way.

After the patterning of the bump supporting layer 3, a thermal annealing operation is carried out at 280 to 320 degrees Celsius, preferably at 300 degrees Celsius. As a result, of which a thermal and mechanical stabilization of the bump supporting layer 3 is carried out. In the course of this baking or curing of the bump supporting layer, the bump supporting layer 3 acquires its outstanding mechanical supporting properties which are required for the later thinning in order to avoid wafer breakage.

Figure 1B:
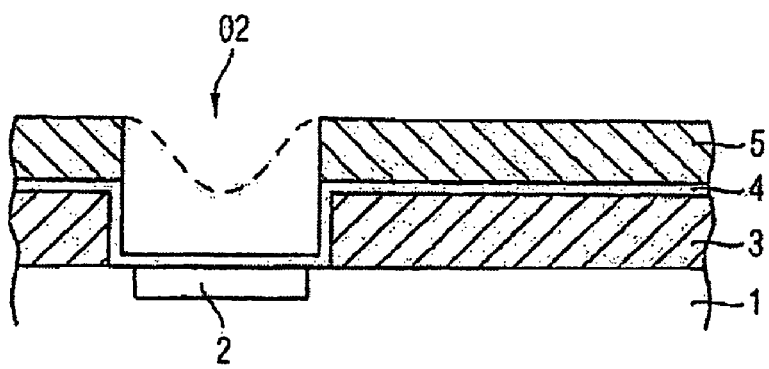

Referring to FIG. 1B, a subsequent step involves forming an electrode layer 4 on the surface of the patterned and cured bump supporting layer 3 and in the opening O1 directly on the surface of the semiconductor circuit 1 and the contact layer elements 2 situated therein. The electrode layer 4 is preferably formed by means of a sputtering or physical vapor deposition (PVD) method over the whole area on the wafer surface and the surface of the patterned and cured bump supporting layer 3, an approximately 200 nm/100 nm thick TiW/Cu or TiW/Ni electrode layer 4 preferably being formed. This so-called "underbump metallization" serves as a plating electrode essentially for realizing a subsequent electroplating operation and furthermore improves the mechanical properties of the contact bumps. Afterward, in accordance with FIG. 1B, an insulating auxiliary layer 5 is formed on the surface of the electrode layer 4. The auxiliary layer 5 essentially defines the overall height of the desired contact bump or the resulting bump metallization. This preferably involves carrying out resist coating by means of a conventional photoresist such as, for example, a negative resist having a thickness of 20 to 50 micrometers, preferably 40 micrometers, whereby a resulting overall height of the layers 3 to 5 of approximately 100 micrometers is obtained.

Finally, the auxiliary layer 5 is in turn patterned in order to uncover the electrode layer 4 in the region of the at least one contact layer element or contact pad 2. Once again a photolithographic patterning using the same mask as in FIG. 1A preferably being carried out. The auxiliary layer opening O2 is accordingly substantially aligned with the bump supporting layer opening O1, for which reason a depression required for the subsequent electroplating operation is now obtained.

Figure 1C:
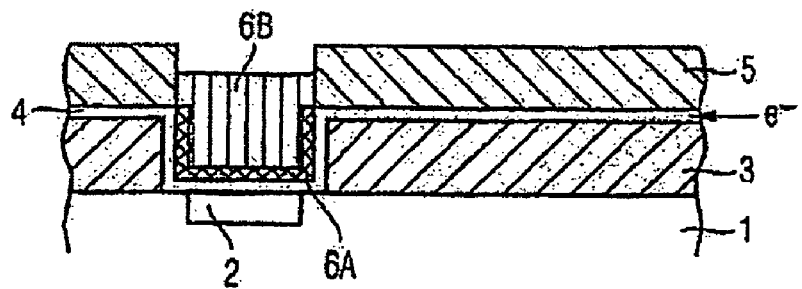

In accordance with FIG. 1C, the bump metallization is then formed on the surface of the uncovered electrode layer 4 within the openings O1 and O2. An electroplating is preferably carried out in this case. An electric current e⁻ is applied to the electrode layer 4 and metallic material from a liquid, for example, depositing on the surface of the uncovered electrode layer 4. In this case, the sections of the electrode layer 4 which are covered by the insulating auxiliary layer 5 are not coated or plated with the bump metallization in this case.

A two-stage electroplating method is preferably carried out, first with an approximately 3 to 5 micrometer thick Cu or Ni adhesion promoter metallization 6A and then an approximately 80 micrometer thick SnAg solder metallization 6B being applied. Such a multilayer structure has further improved mechanical properties on account of the adhesion promoter metallization 6A used.

Figure 1D:
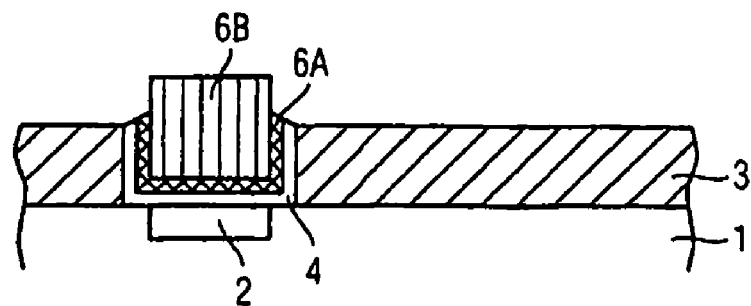

Referring to FIG. 1D, the auxiliary layer 5 and the electrode layer 4 are then removed on the surface of the patterned bump supporting layer 3, the photoresist 5 preferably being stripped and the sputtered electrode layer 4 preferably being etched.

Figure 1E:
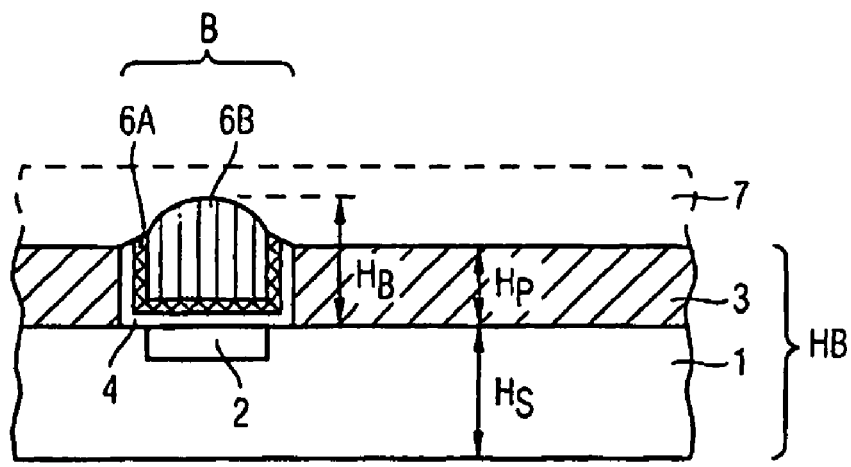

Referring to FIG. 1E, the bump metallization 6A and 6B is then subjected to remelting, the sharp edges of the bump metallization 6A and 6B being rounded at a temperature of approximately 250 degrees Celsius and the final contact bump B being completed. The completed contact bump then has a typical bump height $H_B$ of approximately 90 micrometers, in which case, with a supporting layer thickness $H_P$ of approximately 70 micrometers, a projection of approximately 20 micrometers results for the contact bump. Such a small projection can then be compensated for in a simple manner using conventional grinding films 7, whereby a wafer breakage is reliably prevented.

Accordingly, a processing film or grinding film 7 is then applied on the surface of the bump supporting layer 3 and the bump metallization 6A and 6B and, using said grinding film 7. The semiconductor circuit 1 is finally thinned or ground from its rear side to a desired thickness $H_S$ of the semiconductor circuit 1. The processing film or grinding film 7 is finally pulled away again.

On account of the contact bumps B being embedded in the bump supporting layer 3, it is possible for the first time to produce ultrathin semiconductor circuits having a thickness $H_S$ of well below 300 micrometers, a wafer breakage or the occurrence of fine cracks in the semiconductor circuit 1 being reliably prevented. A yield is accordingly for the first time also substantially increased for ultrathin semiconductor circuits having contact bumps, the overall costs thereby being significantly reduced.

Preferably, the thickness $H_S$ of the semiconductor circuit 1 is less than 100 micrometers. The supporting layer thickness $H_P$ of the bump supporting layer 3 is less than the bump height $H_B$ of the contact bump and greater than or equal to the difference between bump height $H_B$ and half the circuit thickness $H_S$. When this equation $$H_S \geq 2(H_B - H_P)$$

is satisfied, it is accordingly possible to produce semiconductor circuits having contact bumps and having a thickness of less than 100 μm which have a sufficient resistance to breaking.

Furthermore, the resistance to breaking can be optimized through a targeted selection of a modulus of elasticity $E_B$ for the materials of the contact bumps B and a modulus of elasticity $E_P$ for the cured material of the bump supporting layer 3. It is optimal in this case, if the modulus of elasticity $E_P$ of the supporting layer 3 is approximately half as great as the modulus of elasticity $E_B$ of the contact bumps B. To put it more precisely, the supporting layer 3 is approximately half as hard as the contact bump B in this case.

Figure 1F:
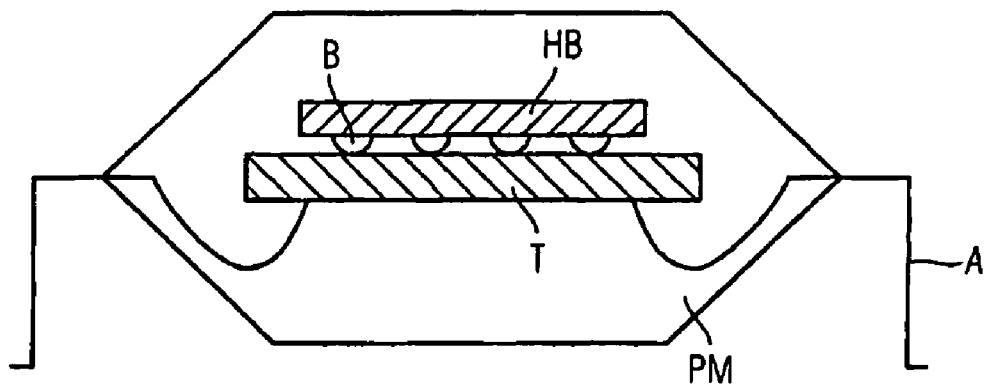

Referring to FIG. 1F, it is further possible for a semiconductor wafer to be sawn in order to singulate the thinned semiconductor circuits 1 into singulated semiconductor components HB. The latter subsequently being contact-connected or soldered by their contact bumps B onto a carrier substrate T in accordance with a customary flip-chip bonding method. The carrier substrate T has in a customary manner connection wires A projecting from a housing formed from molding composition PM. Accordingly, the procedure finally involves encapsulating the semiconductor component HB soldered to the carrier substrate T in a molding composition PM in order to realize a packaged semiconductor component. By so doing, a reduced risk of a delamination and an improved moisture resistance being realized on account of the optimized adhesion properties of the bump supporting layer 3 is realized. A long-term failure of components can thereby be significantly reduced.

Accordingly, on account of the bump supporting layer 3, it is possible to reduce a topography of a wafer surface or a surface of a semiconductor circuit with respect to a contact bump surface from 90 micrometers to 20 micrometers. As a result, it is furthermore possible to use cost-effective standard grinding films for processing and in particular for thinning a semiconductor circuit. On account of the smaller adhesive thickness of the grinding films used, an elasticity is increased and a local penetration through the wafers is reduced, thereby significantly reducing cracking in particular during a grinding operation. Furthermore, a lateral and shearing stability of the contact bumps B is improved by the bump supporting layer 3 arranged on the sidewalls of the bump contacts B. Furthermore, no additional exposure masks or no special process materials are used, for which reason standard processes can be modified in an extremely cost-effective manner.

Figure 2A:
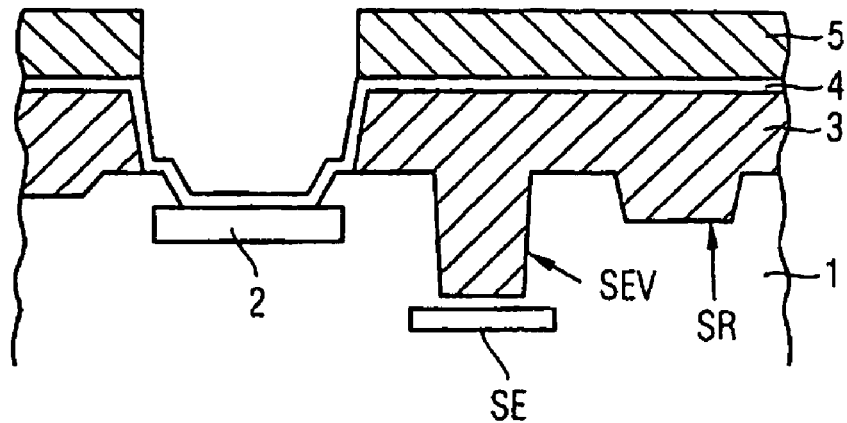
FIGS. 2A to 2C illustrate simplified sectional views for method steps in the production of an ultrathin semiconductor circuit in accordance with a second exemplary embodiment.
Figure 2B:
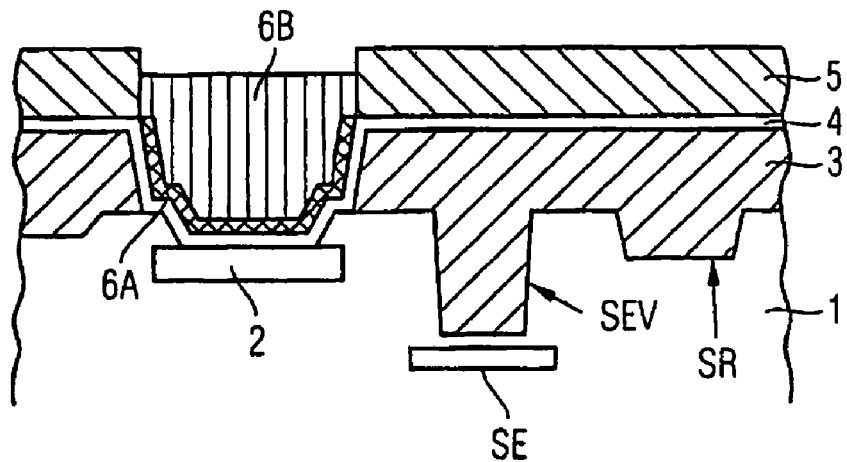
Figure 2C:
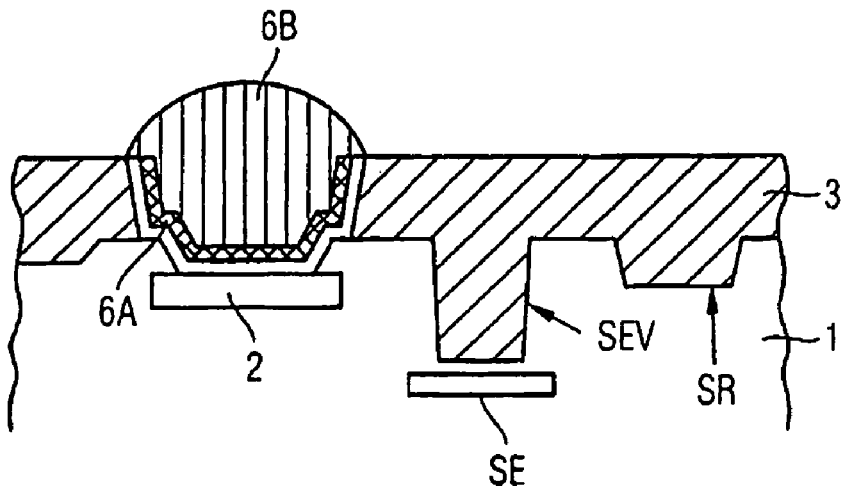

FIGS. 2A to 2C show simplified sectional views illustrating essential method steps in the production of an ultrathin semiconductor circuit having contact bumps in accordance with a second exemplary embodiment, identical reference symbols representing layers or elements identical or corresponding to those in FIG. 1.

Referring to FIGS. 2A to 2C, the semiconductor circuit may furthermore have a fuse element SE with an associated fuse element depression SEV such as is used for example for repairing defective switching elements by means of redundant switching elements. Such fuse elements or fuses SE are usually situated in a deeper region of the semiconductor circuit 1, for which reason a fuse element depression right into the vicinity of the fuse element SE is necessary. Such fuse elements or fuses SE can be closed or opened for example by irradiation by means of laser beams, thus resulting in a multiplicity of repair possibilities in complex semiconductor circuits. However, since the fuse element depressions SEV extend very far into the semiconductor circuit 1, they signify a particular risk for the mechanical stability particularly during a mechanical processing or during a thinning of the semiconductor circuit.

According to the invention, in accordance with FIGS. 2A to 2C, the bump supporting layer 3 is accordingly also introduced into said fuse element depressions SEV and subsequently cured. As a result, the mechanical stability of the semiconductor circuit or the semiconductor wafer can be significantly improved.

In the same way, so-called sawing frames SR are situated between adjacent semiconductor circuits, said sawing frames being required for later singulation and likewise constituting a depression in the semiconductor circuit or in the semiconductor wafer, for which reason they signify an increased risk of breakage during a grinding operation. Such sawing frames SR can also in turn be completely filled by the bump supporting layer 3, thus resulting in a reduced wafer breakage or a reduced risk of cracking during a mechanical processing or thinning of the semiconductor wafer or the semiconductor circuits.

According to the invention, through the use of a temperature-resistant bump supporting layer that remains on the semiconductor circuit or on the semiconductor wafer between the contact bumps, a topography is set to desired values of approximately 20 micrometers, for which reason standard grinding films can compensate for such height differences without any problems and a reduced wafer breakage occurs. Furthermore, the enclosing of the contact bumps B into the supporting layer 3 improves the mechanical strength of the contact bumps, for which reason the risk of a wafer breakage is once again reduced and, moreover, the risk of cracking in the semiconductor circuit is minimized. Since the bump supporting layer 3 furthermore has improved adhesion properties also with respect to an adhesive bond or a housing molding composition, improved moisture barrier properties are furthermore obtained.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

The invention claimed is:

1. An ultrathin semiconductor circuit having contact bumps comprising:

a contact layer element formed in the surface of the semiconductor circuit;

a bump supporting layer formed on the surface of the semiconductor circuit and having a supporting layer thickness and a supporting layer opening for uncovering the contact layer element;

an electrode layer formed on the surface of the contact layer element, wherein portions of the electrode layer are formed within the supporting layer opening of the bump supporting layer;

a bump metallization formed on the electrode layer and serving for realizing the contact bumps with a bump height projecting beyond the supporting layer thickness;

the ultrathin semiconductor circuit having a thickness of less than 300 micrometers; and wherein the supporting layer thickness is less than the bump height and greater than or equal to the difference between the bump height and half the thickness of the ultrathin semiconductor circuit.

2. The ultrathin semiconductor circuit of claim 1, wherein the thickness of the ultrathin semiconductor circuit is less than 100 micrometers.

3. The ultrathin semiconductor circuit of claim 1, wherein the bump height is approximately 90 micrometers.

4. The ultrathin semiconductor circuit of claim 1, wherein the modulus of elasticity of the supporting layer is approximately half as great as the modulus of elasticity of the contact bumps.

5. The ultrathin semiconductor circuit of claim 1, wherein the bump supporting layer has photosensitive BCB or SU-8.

6. The ultrathin semiconductor circuit of claim 1, wherein the adhesion properties of the bump supporting layer are optimized with regard to a molding composition to be used.

7. The ultrathin semiconductor circuit of claim 1, further comprising at least one fuse element with an associated fuse element depression, the fuse element depression being completely filled by the bump supporting layer.

8. The ultrathin semiconductor circuit of claim 1, further comprising at least one sawing frame, the sawing frame being completely filled by the bump supporting layer.

9. The ultrathin semiconductor circuit of claim 1, further comprising a flip-chip-bondable semiconductor component.

* * * * *

UNITED STATES PATENT AND TRADEMARK OFFICE
CERTIFICATE OF CORRECTION

PATENT NO. : 7,868,452 B2
APPLICATION NO. : 11/441978
DATED : January 11, 2011
INVENTOR(S) : Dirk Mueller et al.

Page 1 of 1

It is certified that error appears in the above-identified patent and that said Letters Patent is hereby corrected as shown below:

On the Title Page

Item (75), Replace "Bergisch Gladbach" with --Berglach Gladbach--

Signed and Sealed this
Twenty-second Day of March, 2011

David J. Kappos
*Director of the United States Patent and Trademark Office*

UNITED STATES PATENT AND TRADEMARK OFFICE
CERTIFICATE OF CORRECTION

PATENT NO. : 7,868,452 B2  Page 1 of 1
APPLICATION NO. : 11/441978
DATED : January 11, 2011
INVENTOR(S) : Dirk Mueller et al.

It is certified that error appears in the above-identified patent and that said Letters Patent is hereby corrected as shown below:

Title Page, Item (75) Inventors:
"Berglach Gladbach" (as substituted in the Certificate of Correction issued March 22, 2011) should be deleted and first inventor residence is to read shown in printed patent -- Bergisch Gladbach --.

Signed and Sealed this
Thirteenth Day of September, 2011

David J. Kappos
*Director of the United States Patent and Trademark Office*